United States Patent [19]

Arz et al.

[11] Patent Number: 5,526,231
[45] Date of Patent: Jun. 11, 1996

[54] COOLING UNIT FOR POWER SEMICONDUCTORS

[75] Inventors: Winfried Arz, Burgthann; Karl-Heinz Ideler, Spardorf, both of Germany

[73] Assignee: Siemens Aktiengesellschaft, Munich, Germany

[21] Appl. No.: 356,534

[22] Filed: Dec. 15, 1994

[30] Foreign Application Priority Data

Jan. 20, 1994 [DE] Germany ............... 44 01 607.7

[51] Int. Cl.⁶ ........................................... H05K 7/20
[52] U.S. Cl. ........................ 361/707; 361/689; 361/699
[58] Field of Search ............... 165/80.4; 257/714; 361/688–690, 698–699, 704, 707, 711, 715

[56] References Cited

U.S. PATENT DOCUMENTS

| | | |
|---|---|---|
| 2,942,165 | 6/1960 | Jackson et al. . |
| 5,113,145 | 5/1992 | Ideler et al. . |
| 5,125,451 | 6/1992 | Matthews . |
| 5,232,047 | 8/1993 | Matthews . |
| 5,263,251 | 11/1993 | Matthews . |
| 5,274,920 | 1/1994 | Matthews . |
| 5,349,498 | 9/1994 | Tanzer et al. ............... 361/689 |

FOREIGN PATENT DOCUMENTS

| | | |
|---|---|---|
| 3615782 | 11/1987 | Germany . |
| 8804742 | 4/1988 | Germany . |
| 4131739 | 4/1993 | Germany . |
| 4217289 | 12/1993 | Germany . |
| WO92/17745 | 10/1992 | WIPO . |

OTHER PUBLICATIONS

"Die richtige Wahl," EPP, May, 1991, pp. 40–41.
Patent Abstracts of Japan, E-874, Jan. 17, 1990, vol. 14/No. 22 Patent No. 1-264248.

*Primary Examiner*—Gregory D. Thompson
*Attorney, Agent, or Firm*—Hill, Steadman & Simpson

[57] ABSTRACT

A cooling unit for a number of power semiconductors is formed by a quadrangular tube to which the power semiconductors are secured at an exterior with good thermal conductivity, in an equipping region of the tube. The quadrangular tube has a coolant inlet and a coolant outlet. The quadrangular tube contains a laminarization unit disposed in a region following the coolant inlet, this region overlapping the equipping region. The laminarization unit produces a substantially laminar flow of the coolant in the tube within the aforementioned region. In a region between the laminarization unit and the coolant outlet, the quadrangular tube contains a number of turbulence-producing elements for introducing turbulence into the coolant flow.

11 Claims, 2 Drawing Sheets

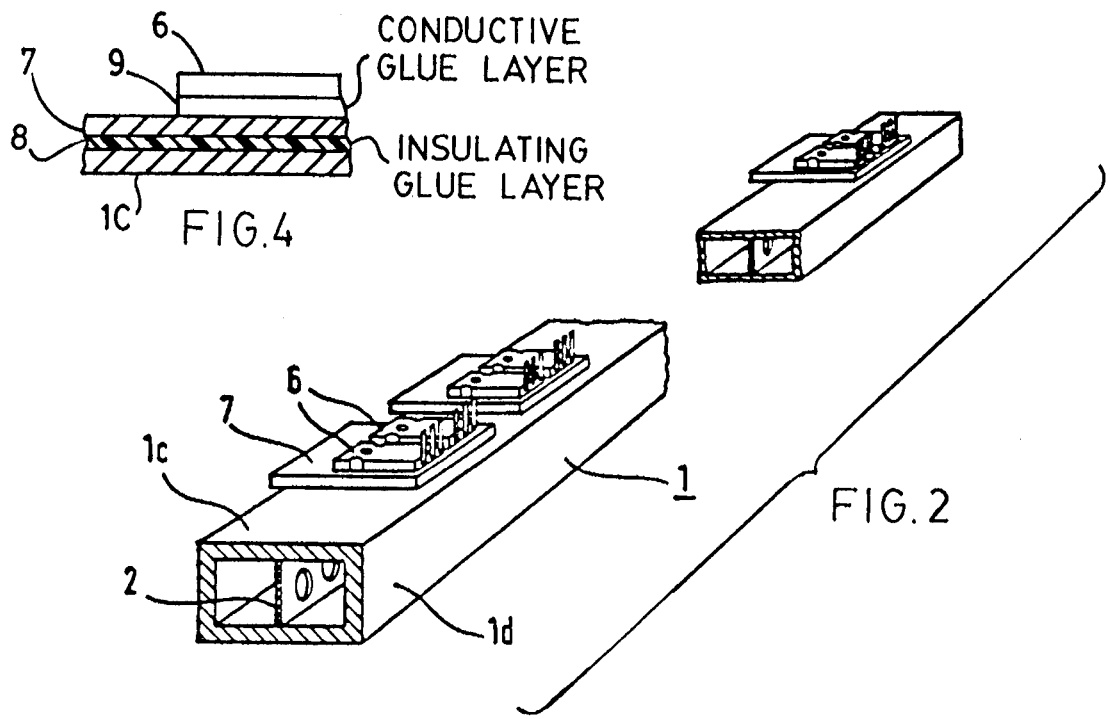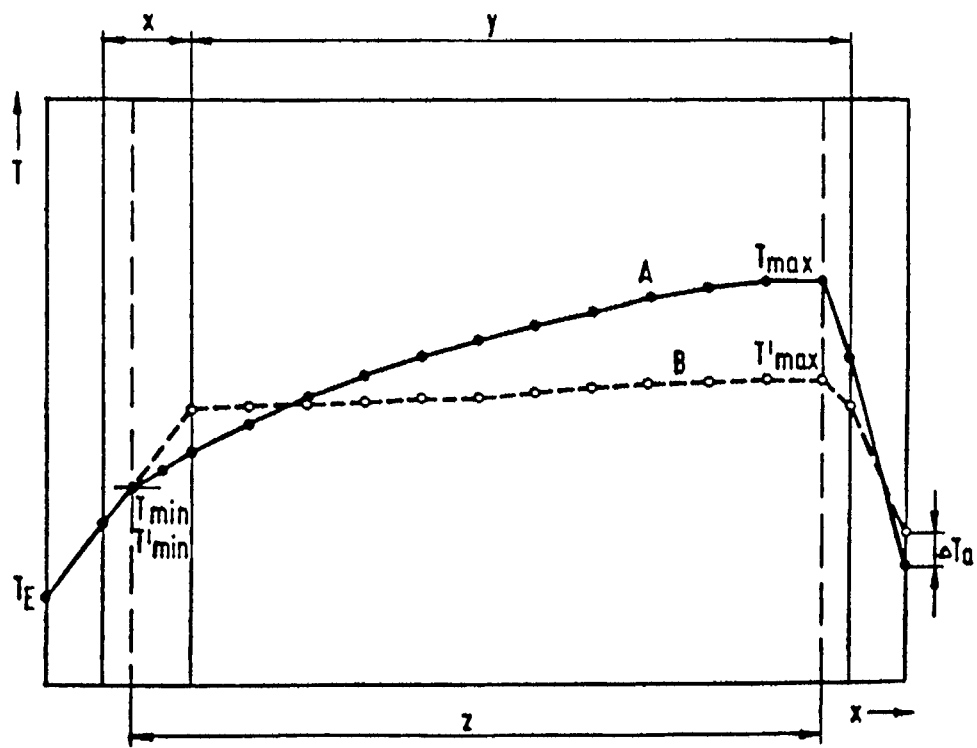

COOLING UNIT FOR POWER SEMICONDUCTORS

BACKGROUND OF THE INVENTION

1. Field of the Invention

The present invention is directed to a cooling unit for power semiconductors.

1. Description of the Prior Art

U.S. Pat. No. 5,113,145 discloses a cooling unit for a number of parallel-connected transistors, whereby the transistors are each respectively secured on a thermally and electrically conductive ring. The transistors are rotationally symmetrically distributed on this ring and are electrically connected thereto by respective terminals. The connections to further terminals of the transistors essentially ensue rotationally-symmetrically by means of large-area printed circuit boards. The ring is air-cooled. Due to the rotational-symmetrical arrangement, a uniform distribution of current to the transistors is assured. The mechanical structure, however, is complicated and can only be economically realized for limited dissipated powers. Moreover, modifying this arrangement to achieve a modular structure, as is often desirable, could be done, if at all, only with great difficulty.

German OS 36 15 782 discloses an arrangement of power transistors arranged in two rows lying opposite one another. All transistors are arranged on a common cooling member which for heat elimination, is secured on a further, ribbed cooling member by mounting screws. Again, only a limited heat elimination is possible with this structure.

German OS 42 17 289 discloses a cooling means wherein a number of semiconductor components are arranged in a cooling channel following one another. In order to improve the heat transmission between the surfaces of the semiconductor components to be cooled and a coolant flowing in the channel, each semiconductor component has at least one side exposed directly to the forced coolant flow in the cooling channel. For reducing the fluid friction, further, this side is provided with a profiled surface microstructure.

German OS 41 31 739 discloses a cooling means for electrical components, wherein corrugated plates are provided in a cooling channel for producing turbulence in a flowing coolant. Heat elimination is stated to be improved as a result of the turbulence.

SUMMARY OF THE INVENTION

An object of the present invention is to construct a cooling unit for power semiconductors wherein a high heat elimination is guaranteed given a simple mechanical structure. A further object of the present invention is to provide such a cooling unit wherein the operating temperatures of the individual transistors should thereby deviate only slightly from one another.

The above object is achieved in accordance with the principles of the present invention in a cooling unit for power semiconductors having a quadrangular tube with at least two power semiconductors secured thereto with good thermal conductivity. The power semiconductors are secured to the quadrangular tube within a "equipping region" thereof. The quadrangular tube has a coolant inlet at a first end and a coolant outlet at an opposite, second end. The quadrangular tube contains a laminarization unit for laminarizing the coolant flow at one end of the tube, in a region immediately following the coolant inlet, this region overlapping with the equipping region. Turbulence-producing elements for introducing turbulence into the coolant flow are also contained in the quadrangular tube, in a region between the laminarization unit and the coolant outlet.

The coolant outlet is removable from the quadrangular tube, so that an insert, which includes the laminarization unit and the turbulence elements, can be inserted into the interior of the quadrangular tube, and the coolant outlet then being closed in a fluid-tight manner.

DESCRIPTION OF THE DRAWINGS

FIG. 2 is a perspective view of the quadrangular tube of FIG. 1, but having mounted power semiconductors.

FIG. 3 is a temperature diagram showing the heat elimination achieved by a cooling unit constructed in accordance with the principles of the present invention.

FIG. 4 is an enlarged view, partly in section, of a portion of the cooling unit of FIG. 2.

DESCRIPTION OF THE PREFERRED EMBODIMENTS

Figure 1:
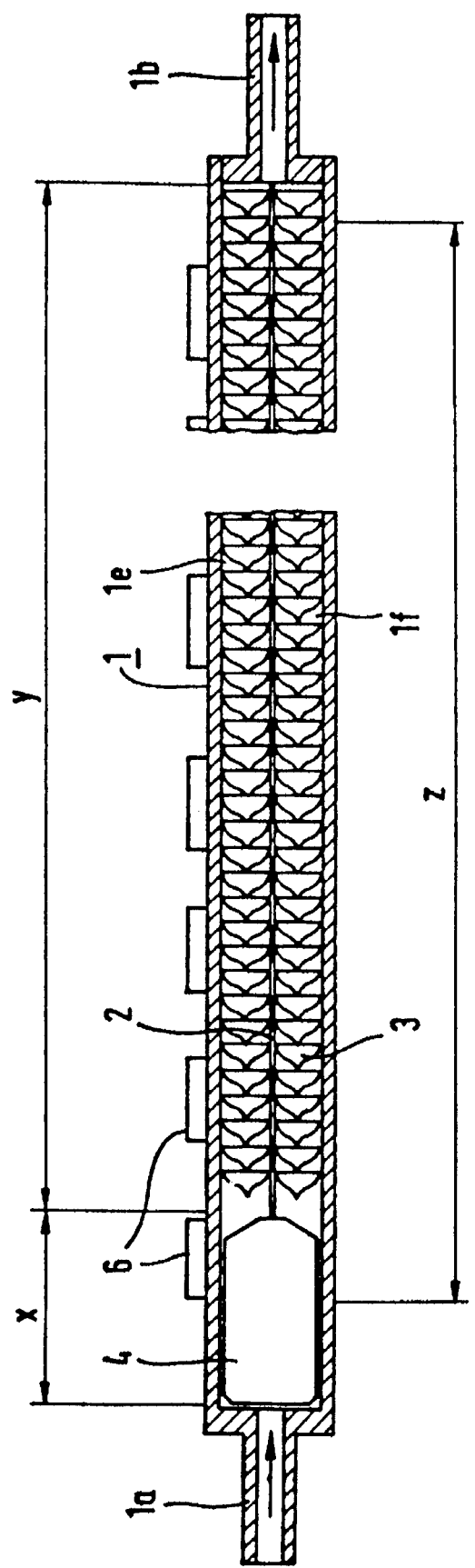
FIG. 1 is a longitudinal section through a cooling unit constructed in accordance with the principles of the present invention showing a quadrangular tube without mounted power semiconductors.

An exemplary embodiment of a cooling unit in accordance with the invention, which is operated with water as coolant in the exemplary embodiment is shown in FIGS. 1 and 2. The cooling unit is formed by a quadrangular tube 1 that is preferably composed of copper. In the embodiment shown in FIG. 2, the tube 1 has a wider side $1c$ and a shorter side $1d$ (with corresponding sides respectively opposite sides $1c$ and $1d$). A flange having a plug-in nipple $1a$ that serves as a water inlet is provided at a first end of the quadrangular tube 1. A second flange having a plug-in nipple $1b$ that serves as water outlet is provided at the other end of the quadrangular tube 1. The second flange is detachably connected to the quadrangular tube 1, for example is pressed therein, in order to insert internal elements into the quadrangular tube 1 with the second flange removed.

The quadrangular tube 1 is divided into two chambers $1e$ and $1f$ over its length by a partition 2. The partition 2 is perforated so that water exchange is possible between the two chambers $1e$ and $1f$.

A laminarization unit 4 in the form of a plate that is intended to reduce the heat exchange transversely to the main flow direction is provided in the quadrangular tube 1 in a region x following the water admission $1a$.

The cooling tube is equipped with power semiconductors 6 in an equipping region z, whereby the region x of the laminarization unit 4 projects into the equipping region z.

A turbulence element 3 is provided in each chamber $1e$ and $1f$ in the remaining region y from the laminarization unit 4 to the water outlet. The partition 2 prevents the turbulence elements 3 from sliding into one another. Since the turbulence elements 3 substantially fill the respective chambers $1e$ and $1f$, no separate fastening is necessary.

Respective water hoses are connected to the nipples $1a$ and $1b$ of the water admission and outlet during operation and a water flow is produced through the cooling unit. Due to the combination of the laminarization unit 4 and the turbulence elements 3, only a slight temperature gradient occurs over a large region of the cooling unit. This is shown below with reference to the temperature diagram of FIG. 3.

The characteristic data of power semiconductor elements are generally highly temperature-dependent. Temperature differences are particularly disturbing when power semiconductors are connected together in parallel. Typically, the temperatures of semiconductors connected parallel should not differ from one another by more than 5° C. The region of the cooling unit equipped with semiconductors is referenced z in the temperature diagram of FIG. 3. Curve A shows the temperature curve at the upper side of the quadrangular tube 1 given a linearly constant introduction of a thermal load of approximately 1.2 kW without special flow mechanisms in the tube; the curve B shows the corresponding temperature curve with the laminarization unit 4 and the turbulence elements 3 shown in FIGS. 1 and 2. For a predetermined flow, the extreme values of the measuring points located in the equipping region z did not lie within the prescribed range of 5° C. given a tube without such inserts (curve A). The following minimum temperature $T_{min}$ and maximum temperature $T_{max}$ were measured in the equipping region z:

$T_{min}$=11.5° C. $T_{max}$=29.7° C.

A temperature difference $\Delta T$=18.2° C. derives therefrom, which is far above the aforementioned tolerance band of 5° C.

The flow conditions, and thus the temperature curve, change due to the insertion of the laminarization unit 4 and of the turbulence elements 3. An inherently good turbulence, and thus a low surface temperature of the quadrangular tube 1, would be established in the region of the water admission 1a. Due to the laminarization element 4, however, the heat exchange transversely relative to the main flow direction is suppressed and the temperature gradient is thus raised in a region where the first group of power semiconductors is arranged. The region of the laminarization unit 4 thus serves as a pre-heating stage in order to initially heat the coolant in a controlled fashion.

Radial sub-streams of the coolant are generated in the following region by the turbulence elements 3 and the temperature curve is flattened as a result of an improvement of the heat exchange. The corresponding temperature curve is referenced B in FIG. 3. Measurements made with the cooling unit shown in FIGS. 1 and 2 have yielded the following values for the minimum temperature $T'_{min}$ and for the maximum temperature $T'_{max}$ at the surface of the cooling unit in the equipping region:

$T'_{min}$=10.7° C. $T'_{max}$=15.5° C.

A temperature difference $\Delta T$ of 4.8° C. is thus obtained, which is within the required range. The turbulence elements can thus be fashioned such that only a slight increase in pressure loss occurs. The turbulence elements 3 lie freely in the chambers 1e and 1f, but can be kept from rotating around their axes by screw-like sections with opposite rotationally directions adjoining each element 3.

The outlet temperature in the case of the temperature curve B is higher by $\Delta Ta$ than in the case of the temperature curve A, i.e. the cooling water has absorbed more thermal energy with the described arrangement of laminarization unit 4 and turbulence elements 3.

The cooling conditions for the power semiconductors 6 can be improved further when these are mounted on cooling plates 7, as shown in FIG. 2. These cooling plates 7 can be copper plates, for example, and may have a thickness of approximately 3 mm. A heat capacity capable of handling the load peaks of the power semiconductors 6 is thus achieved. Advantageously, a pair of interconnected power semiconductors 6 is mounted on each cooling plate 7, so that the heat output of this transistor pair is dissipated. The heat flow can propagate over a large-area within the radiant plate 7.

The cooling plates 7 are advantageously glued onto the quadrangular tube 1 by a glue layer 8 (shown enlarged and exaggerated in FIG. 4). Since the quadrangular tube 1 carries a number of power semiconductors, the glue layer 8 between the cooling plates 7 and the quadrangular tube 1 must generally be electrically insulating. At the same time, an adequate mechanical strength of the glued connection is required. These demands can be met with the glue layer 8 formed of a ceramic-containing epoxy resin system. By means of gluing using such a resin system, a comparatively low thermal resistance of 0.34 K/W having low fluctuations (approximately ±10%) from power semiconductor-to-power semiconductor is achieved given a breakdown resistance of, for example, 2.4 kV. The connection between the power semiconductors 6 and the cooling plates 7 can likewise advantageously ensue by gluing, with a glue layer 9 (also shown enlarged and exaggerated in FIG. 4). For this purpose, however, the tube power semiconductors 6 mounted on a cooling plate 7 are to be electrically connected to one another in many instances. In this case, a commercially obtainable thermally and electrically conductive epoxy resin system is advantageously employed. Thermal resistance values of approximately 0.1 K/W with reference to one component can be achieved by in this manner.

The disclosed cooling unit can be simply and economically fabricated because simple and inexpensive untooled parts can be employed, for example, as the quadrangular tube. Complicated extrusion molded parts or milled parts are often required in known cooling devices. The cooling unit can be flexibly utilized and can be modularly assembled to meet the power demands because a number of electronic assemblies as shown in FIG. 2, can be electrically interconnected and joined on the same cooling unit. Slight variations in the physical properties of the individual units which may be required can be unproblematically accommodated. The linear embodiment of each unit enables simple assembly of a number of units, for example, in electronics cabinets using the same water flow.

Although modifications and changes may be suggested by those skilled in the art, it is the intention of the inventors to embody within the patent warranted hereon all changes and modifications as reasonably and properly come within the scope of their contribution to the art.

We claim as our invention:

1. A cooling unit for power semiconductors comprising:

a quadrangular tube having an equipping region;

means for securing at least two power semiconductors to an exterior of said quadrangular tube within said equipping region with good thermal conductivity between said at least two power semiconductors and said quadrangular tube;

said quadrangular tube having a coolant inlet at a first end thereof and a coolant outlet at an opposite, second end thereof;

a laminarization means contained in said quadrangular tube for laminarizing coolant flow in said quadrangular tube in a region following said coolant inlet in a direction of coolant flow, said region following said coolant inlet overlapping said equipping region; and at least one turbulence-producing element for introducing turbulence into said coolant flow disposed in a region in said quadrangular tube between said laminarization unit and said coolant outlet.

2. A cooling unit as claimed in claim 1 comprising at least two said turbulence-producing elements and further comprising a partition disposed in said quadrangular tube laterally dividing said quadrangular tube into two chambers, each of said two chambers containing at least one of said turbulence-producing elements.

3. A cooling unit as claimed in claim 2 wherein said partition contains a plurality of openings therein permitting fluid exchange between said two chambers.

4. A cooling unit as claimed in claim 1 wherein each of said coolant inlet and said coolant outlet comprises a flange having a plug-in nipple adapted for receiving a coolant hose.

5. A cooling unit as claimed in claim 4 wherein one of said flanges is removably held in said quadrangular tube.

6. A cooling unit as claimed in claim 1 wherein said means for securing said at least two power semiconductors to said exterior of said quadrangular tube comprises a thermally conductive glue.

7. A cooling unit as claimed in claim 1 further comprising a cooling plate disposed between said at least two power semiconductors and said exterior of said quadrangular tube, said at least two power semiconductors being attached to said cooling plate by a glue, and said cooling plate being attached to said exterior of said quadrangular tube by a glue.

8. A cooling unit as claimed in claim 7 wherein said glue attaching said power semiconductors to said cooling plate comprises an electrically conductive glue, and wherein said glue attaching said radiant plate to said exterior of said quadrangular tube comprises an electrically insulating glue.

9. A cooling unit as claimed in claim 8 wherein said electrically insulating glue comprises a ceramic-filled epoxy resin.

10. A cooling unit as claimed in claim 8 wherein said electrically conductive glue comprises an electrically conductive epoxy resin system.

11. A cooling unit as claimed in claim 1 wherein said means for laminarizing the coolant flow and said turbulence-producing at least one element comprises a unit insertable into an interior of said quadrangular tube through one of said ends thereof.

* * * * *